(12) United States Patent
Hakura et al.

(10) Patent No.: US 11,016,802 B2
(45) Date of Patent: May 25, 2021

(54) TECHNIQUES FOR ORDERING ATOMIC OPERATIONS

(71) Applicant: NVIDIA Corporation, Santa Clara, CA (US)

(72) Inventors: Ziyad Hakura, San Jose, CA (US); Olivier Giroux, Santa Clara, CA (US); Wishwesh Gandhi, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 15/881,587

(22) Filed: Jan. 26, 2018

(65) Prior Publication Data

US 2019/0235915 A1    Aug. 1, 2019

(51) Int. Cl.
*G06F 12/02*    (2006.01)
*G06F 9/48*    (2006.01)
*G06F 12/06*    (2006.01)
*G06F 9/46*    (2006.01)
*G06F 9/52*    (2006.01)

(52) U.S. Cl.
CPC ............ *G06F 9/4843* (2013.01); *G06F 9/461* (2013.01); *G06F 12/06* (2013.01); *G06F 9/52* (2013.01); *G06F 2209/462* (2013.01); *G06F 2209/521* (2013.01); *G06F 2212/1008* (2013.01)

(58) Field of Classification Search
CPC .................................................. G06F 9/4843
USPC ......................................................... 711/108
See application file for complete search history.

(56) References Cited

U.S. PATENT DOCUMENTS

| 7,502,826 B2 | 3/2009 | Barron et al. |
| 9,542,313 B2 | 1/2017 | Hiramoto et al. |
| 2012/0166739 A1 | 6/2012 | Lai et al. |
| 2015/0006808 A1* | 1/2015 | Miller .................... G11C 15/00 711/108 |

* cited by examiner

*Primary Examiner* — Jae U Yu
(74) *Attorney, Agent, or Firm* — Artegis Law Group, LLP (57) ABSTRACT

In various embodiments, an ordered atomic operation enables a parallel processing subsystem to executes an atomic operation associated with a memory location in a specified order relative to other ordered atomic operations associated with the memory location. A level 2 (L2) cache slice includes an atomic processing circuit and a content-addressable memory (CAM). The CAM stores an ordered atomic operation specifying at least a memory address, an atomic operation, and an ordering number. In operation, the atomic processing circuit performs a look-up operation on the CAM, where the look-up operation specifies the memory address. After the atomic processing circuit determines that the ordering number is equal to a current ordering number associated with the memory address, the atomic processing circuit executes the atomic operation and returns the result to a processor executing an algorithm. Advantageously, the ordered atomic operation enables the algorithm to achieve a deterministic result while optimizing latency.

21 Claims, 6 Drawing Sheets

TECHNIQUES FOR ORDERING ATOMIC OPERATIONS

BACKGROUND OF THE INVENTION

Field of the Invention

Embodiments of the present invention relate generally to graphics processing and, more specifically, to techniques for ordering atomic operations.

Description of the Related Art

Graphics processing units (GPUs) are capable of very high performance using a relatively large number of small, parallel threads that execute on programmable hardware processing cores. To avoid thread interleaving when concurrently operating on a location in shared memory, threads may execute atomic operations that can be completed without other threads interrupting those operations. In general, consistent ordering of atomic operations is required for many algorithms to achieve deterministic results when executing on GPUs. In particular, inconsistent ordering of atomic operations when executing graphics algorithms can result in visual artifacts that degrade the overall quality of rendered images.

For example, three-dimensional (3D) rendering can be susceptible to a phenomenon known as "Z-fighting." This phenomenon occurs when two overlapping triangles end up having identical depth values due to the limited precision of floating point values. As a consequence of Z-fighting, the color of each pixel that is overlapped by the two "dueling" triangles continually varies depending on the order in which operations are performed on the pixel. The ultimate result is that the image appears to flicker, and the image also may lose meaning.

In one approach to ensuring deterministic results, applications implement a consistent ordering of atomic operations via software. In such implementations, before performing an atomic operation that could potentially result in non-deterministic results, the application waits until a current ordering number matches an ordering number associated with the atomic operation. More specifically, code implemented in software repeatedly loops and compares the current ordering number and the ordering number of the atomic operation until determining that the current ordering number matches the ordering number of the atomic operation. One drawback of this approach is that performing each comparison operation between the current ordering number and the ordering number of the atomic operation typically involves a round-trip to cache memory that can take several hundred clock cycles. Accordingly, such software-based solutions may result in unacceptably long latencies.

As the foregoing illustrates, what is needed in the art are more effective techniques for processing atomic operations in a consistently ordered fashion.

SUMMARY OF THE INVENTION

One embodiment of the present invention sets forth a system that processes atomic operations. The system includes a first memory slice that includes a first memory address; a content-addressable memory (CAM) that stores a first ordered atomic operation specifying the first memory address; and an atomic processing circuit that performs a look-up operation on the CAM, where the look-up operation specifies the first memory address, receives the first ordered atomic operation from the CAM in response to the look-up operation, determines that a first ordering number specified in the first ordered atomic operation is equal to a first current ordering number associated with the first memory address, and processes a first atomic operation specified in the first ordered atomic operation.

One advantage of the disclosed system is that it enables algorithms that execute on parallel processors to achieve deterministic results more efficiently relative to prior art solutions. First, by executing ordered atomic operations in a specified order, the disclosed system enables algorithms to produce deterministic results. Further, because the disclosed system stores ordered atomic operations for future processing in an associated CAM, the latencies associated with ordering atomic operations are decreased relative to the latencies typically experienced with prior art solutions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skilled in the art that the present invention may be practiced without one or more of these specific details.

System Overview

Figure 1:
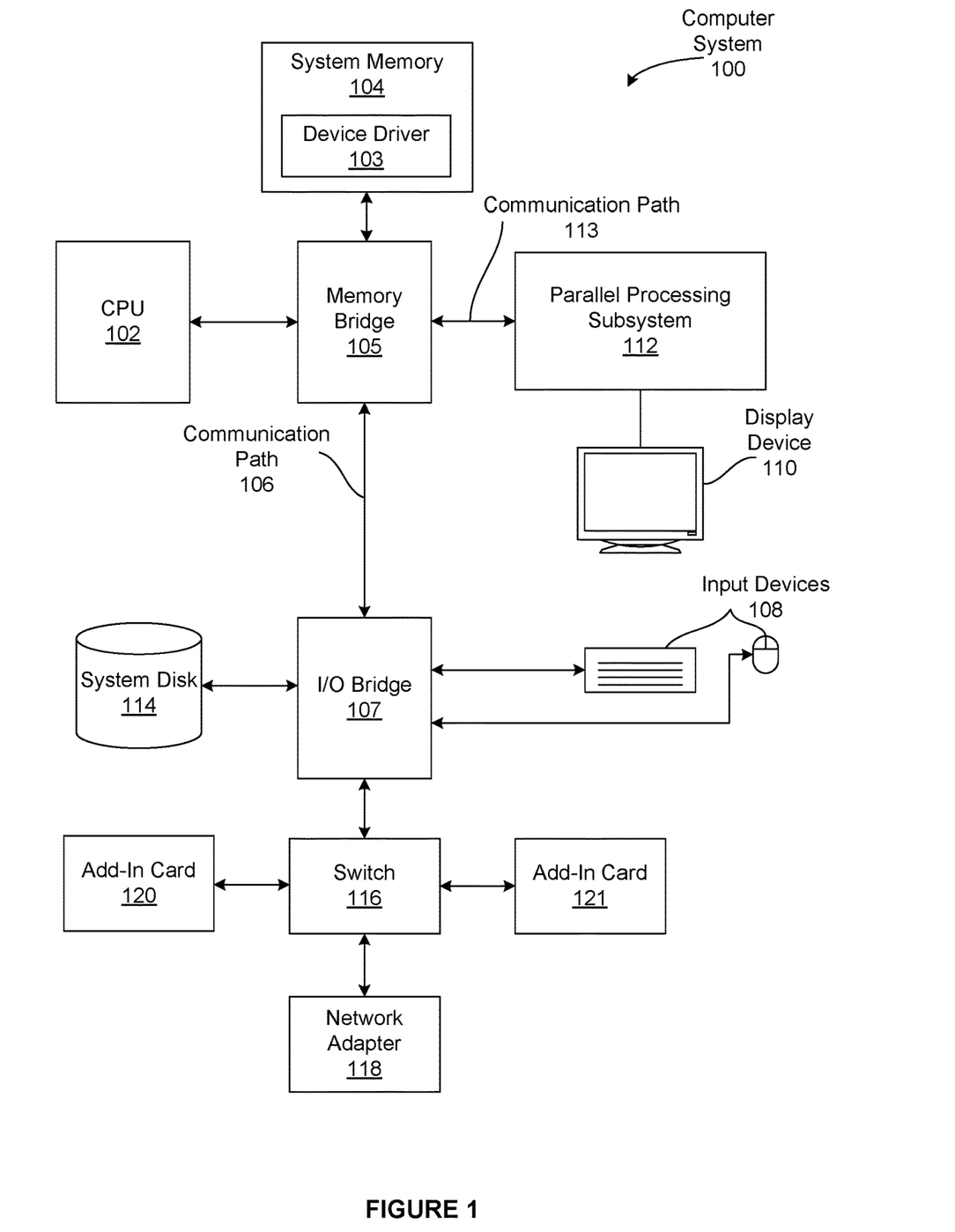
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. In some embodiments, the computer system 100 is a game console. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbrige chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processors (PPs) included within parallel processing subsystem 112. In other embodiments, the parallel processing subsystem 112 incorporates circuitry optimized for general purpose and/or compute processing. Again, such circuitry may be incorporated across one or more PPs included within parallel processing subsystem 112 that are configured to perform such general purpose and/or compute operations. In yet other embodiments, the one or more PPs included within parallel processing subsystem 112 may be configured to perform graphics processing, general purpose processing, and compute processing operations. System memory 104 includes at least one device driver 103 configured to manage the processing operations of the one or more PPs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
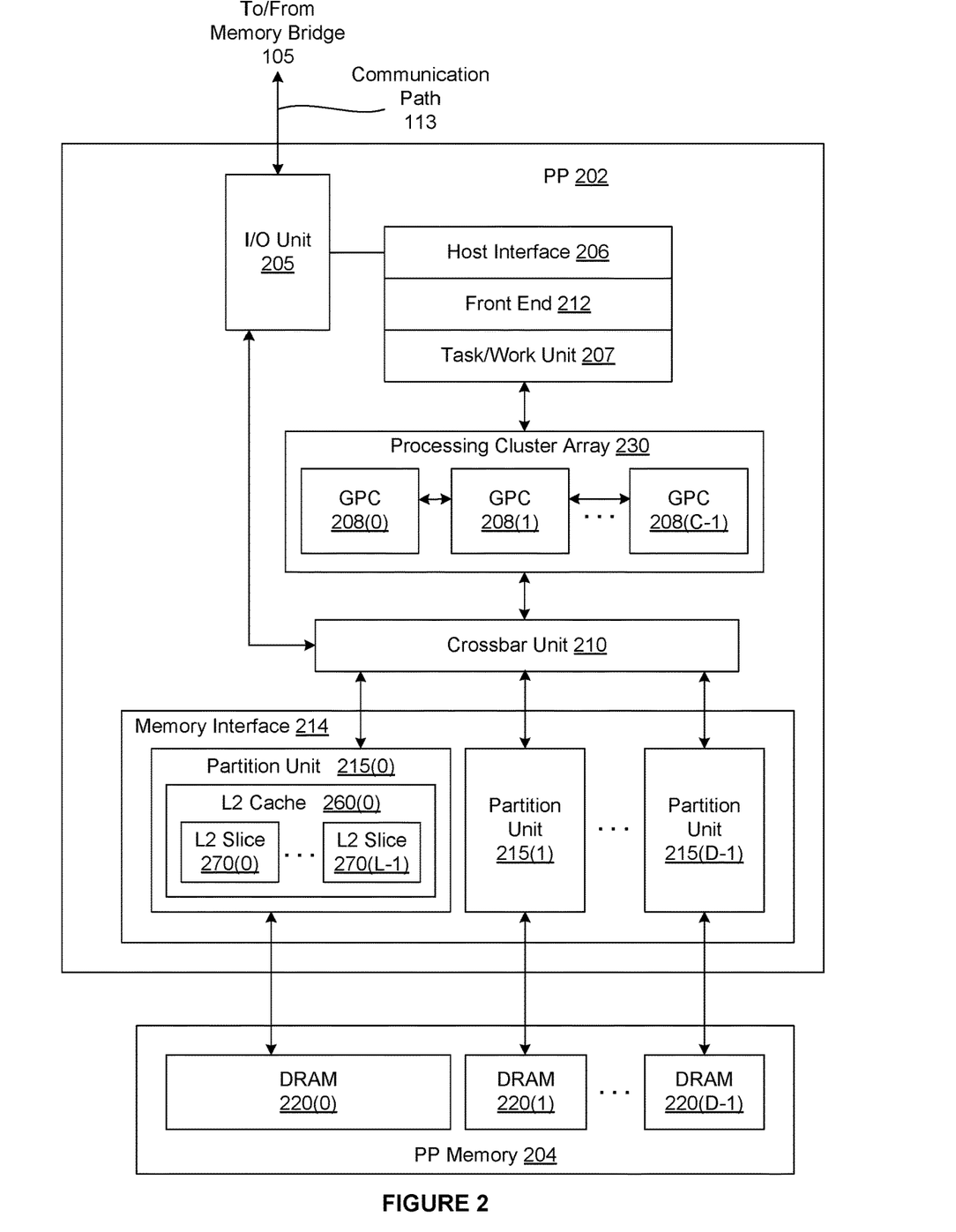
FIG. 2 is a more detailed block diagram of a parallel processor included in the parallel processing subsystem of FIG. 1, according to various embodiments of the present invention.

FIG. 2 is a more detailed block diagram of a parallel processor 202 included in the parallel processing subsystem 112 of FIG. 1, according to various embodiments of the present invention. Although FIG. 2 depicts one PP 202, as indicated above, parallel processing subsystem 112 may include any number of PPs 202. As shown, PP 202 is coupled to a local parallel processing (PP) memory 204. PP 202 and PP memory 204 may be implemented using one or more integrated circuit devices, such as programmable processors, application specific integrated circuits (ASICs), or memory devices, or in any other technically feasible fashion.

In some embodiments, PP 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PP 202 also may be configured for general-purpose processing and compute operations.

In operation, CPU 102 is the master processor of computer system 100, controlling and coordinating operations of other system components. In particular, CPU 102 issues commands that control the operation of PP 202. In some embodiments, CPU 102 writes a stream of commands for PP 202 to a data structure (not explicitly shown in either FIG. 1 or FIG. 2) that may be located in system memory 104, PP memory 204, or another storage location accessible to both CPU 102 and PP 202. A pointer to the data structure is written to a pushbuffer to initiate processing of the stream of commands in the data structure. The PP 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PP 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PP 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PP 202 to the rest of computer system 100 may be varied. In some embodiments, parallel processing subsystem 112, which includes at least one PP 202, is implemented as an add-in card that can be inserted into an expansion slot of computer system 100. In other embodiments, PP 202 can be integrated on a single chip with a bus bridge, such as memory bridge 105 or I/O bridge 107. Again, in still other embodiments, some or all of the elements of PP 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PP 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D 1. As shown, each of the partition units 215 includes, without limitation, a level 2 (L2) cache 260. Each of the L2 caches 260 includes any number of L2 slices 270. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPCs 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PP 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PP 202 is configured to transfer data from system memory 104 and/or PP memory 204 to one or more on-chip memory units, process the data, and write result data back to system memory 104 and/or PP memory 204. The result data may then be accessed by other system components, including CPU 102, another PP 202 within parallel processing subsystem 112, or another parallel processing subsystem 112 within computer system 100.

As noted above, any number of PPs 202 may be included in a parallel processing subsystem 112. For example, multiple PPs 202 may be provided on a single add-in card, or multiple add-in cards may be connected to communication path 113, or one or more of PPs 202 may be integrated into a bridge chip. PPs 202 in a multi-PP system may be identical to or different from one another. For example, different PPs 202 might have different numbers of processing cores and/or different amounts of PP memory 204. In implementations where multiple PPs 202 are present, those PPs may be operated in parallel to process data at a higher throughput than is possible with a single PP 202. Systems incorporating one or more PPs 202 may be implemented in a variety of configurations and form factors, including, without limitation, desktops, laptops, handheld personal computers or other handheld devices, servers, workstations, game consoles, embedded systems, and the like.

Figure 3:
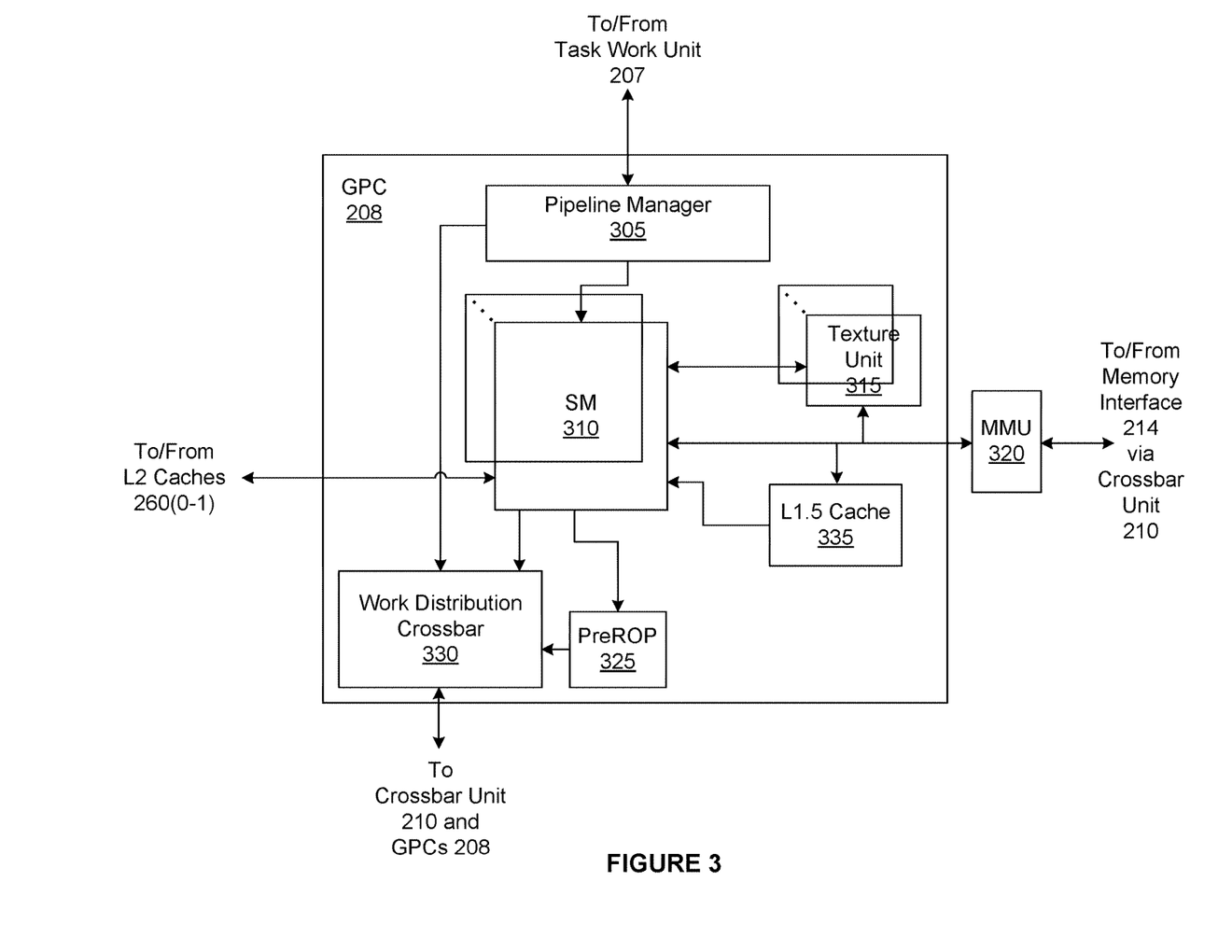
FIG. 3 is a more detailed block diagram of a general processing cluster included in the parallel processor of FIG. 2, according to various embodiments of the present invention.

FIG. 3 is a more detailed block diagram of a general processing cluster 208 included in the parallel processor 202 of FIG. 2, according to various embodiments of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to the level two (L2) caches 260 that are shared among all GPCs 208 in PP 202. The L2 caches 260 may be used to transfer data between threads. Finally, SMs 310 also have access to off-chip "global" memory, which may include PP memory 204 and/or system memory 104. It is to be understood that any memory external to PP 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in one of the L2 caches 260, parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processors, such as SMs 310, texture units 315, or preROP units 325, may be included within GPC 208. Further, as described above in conjunction with FIG. 2, PP 202 may include any number of GPCs 208 that are configured to be functionally similar to one another so that execution behavior does not depend on which GPC 208 receives a particular processing task. Further, each GPC 208 operates independently of the other GPCs 208 in PP 202 to execute tasks for one or more application programs. In view of the foregoing, persons of ordinary skill in the art will appreciate that the architecture described in FIGS. 1-3 in no way limits the scope of the present invention.

As is well known, to avoid thread interleaving when concurrently operating on a location in shared memory, threads may execute atomic operations that complete uninterrupted by other threads. In general, consistent ordering of atomic operations is required for many algorithms to achieve deterministic results when executing on the parallel processing subsystem 112. In particular, inconsistent ordering of atomic operations when executing graphics algorithms can result in visual artifacts that degrade the overall quality of rendered images.

For example, three-dimensional (3D) rendering is susceptible to a phenomenon known as "Z-fighting." Z-fighting occurs when, because of the limited precision of floating point values, two overlapping triangles have identical depth values. The color of each pixel that is overlapped by the two triangles continually varies depending on the order in which operations are performed on the pixel. Accordingly, the overall image appears to flicker and may lose meaning.

In one approach to ensuring deterministic results, applications implement a consistent ordering of atomic operations via software. Before performing an atomic operation that could potentially result in non-deterministic results, an application waits until a current ordering number matches an ordering number associated with the atomic operation. More specifically, code implemented in software repeatedly loops and compares the current ordering number and the ordering number until determining that the current ordering number matches the ordering number. One limitation of implementing a consistent ordering for atomic operations in software is that performing each comparison operation typically involves a round-trip from the SM 310 to the L2 cache 260 that takes several hundred clock cycles. As a result, achieving deterministic results via software may result in unacceptably long latency.

Implementing Ordered Atomic Operations

To enable code executing on the parallel processing subsystem 112 to produce deterministic results without unacceptably long latency, the L2 caches 260 execute atomic operations in a consistently ordered fashion based on an "ordered atomic instruction." More specifically, applications may specify any number of ordered atomic instructions in the code, and the L2 slices 270 executes the ordered atomic instructions as per ordering numbers specified in the ordered atomic instructions.

Advantageously, because the ordering of atomic operations is implemented in hardware included in the L2 slice 270, the latencies associated with ordering atomic operations are decreased relative to the latencies typically experienced with prior art solutions. Further, because each of the L2 slices 270 individually performs ordering of atomic operations, the associated throughputs are increased relative to the throughputs typically experienced with prior art solutions.

Figure 4:
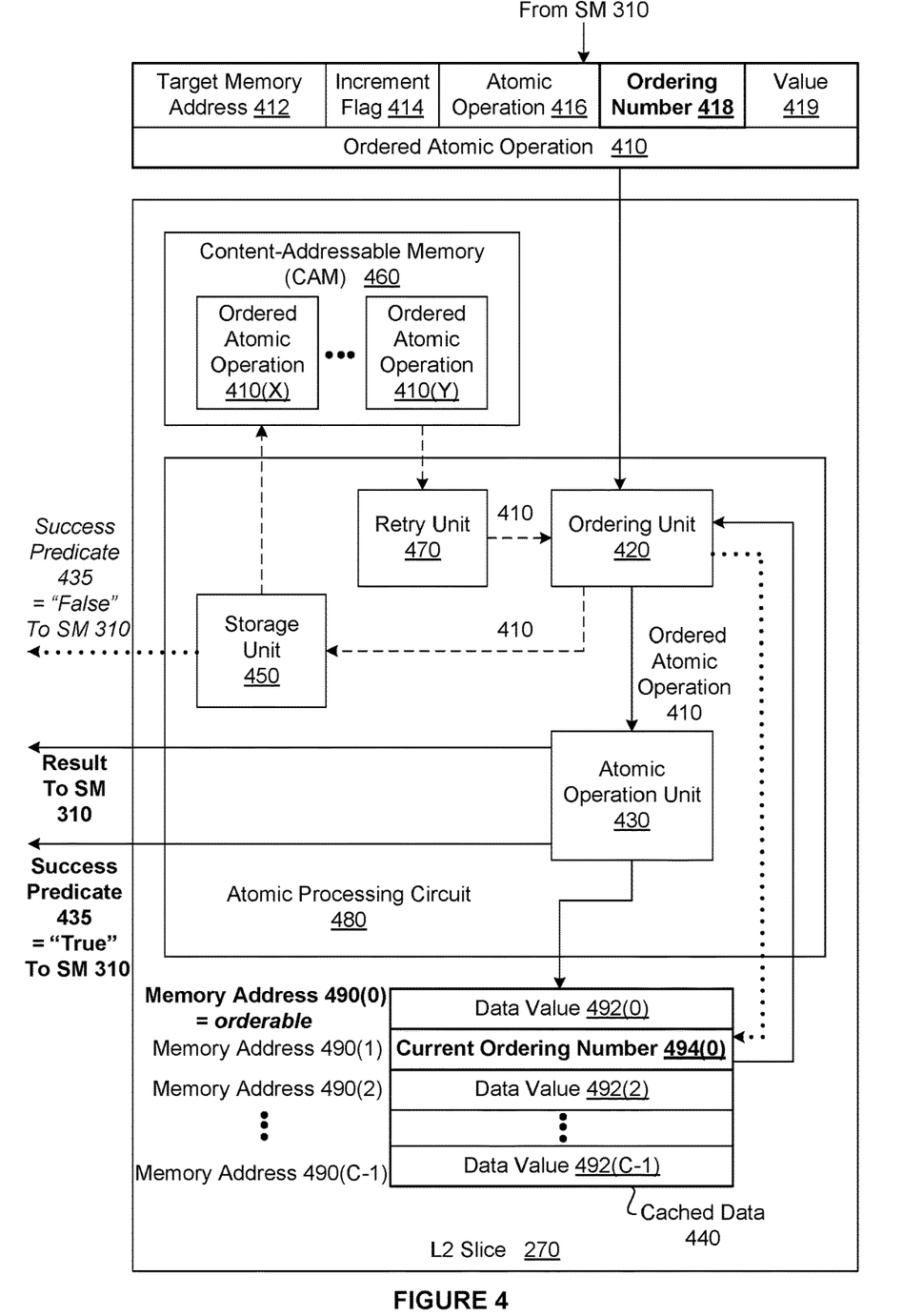
FIG. 4 is a more detailed block diagram of one of the L2 slices of FIG. 2, according to various embodiments of the present invention.

FIG. 4 is a more detailed block diagram of one of the L2 slices 270 of FIG. 2, according to various embodiments of the present invention. As shown, the L2 slice 270 includes, without limitation, cached data 440, an atomic processing circuit 480, and a content-addressable memory (CAM) 460. As shown, the cached data 440 is capable of storing data for at most C memory addresses 490, where C is implementation-specific.

Any number of the memory addresses 490 may be configured as "orderable." When a particular memory address 490(x) is configured as orderable, another memory address 490(y) is configured to store a current ordering number 494(x) that is associated with the memory address 490(x). Each of the memory addresses 490 that does not store one of the current ordering numbers 494 stores a data value 492. In general, the data value 492(x) may be represented using one total number of bits (e.g., 64), while the associated current ordering number 494(x) may be represented using another total number of bits (e.g., 16).

Each of the memory addresses 490 may be configured as orderable in any technically feasible fashion. Further, the memory addresses 490 that store the associated current ordering numbers 494 may be identified in any technically feasible fashion. For instance, in various embodiments, an application programming interface (API) enables code to specify the memory addresses 490 that are to be configured as orderable. For each memory address 490(x) that is configured as orderable, the current ordering number 494(x) is initialized to zero and stored in the following memory address 490(x+1). Subsequently, the code may read from and/or write to the current ordering number 494 via any number and type of additional operations (e.g., compare, compare, etc) as known in the art.

For explanatory purposes and as shown in FIG. 4, the memory address 490(0) stores a data value 492(0) and is configured as orderable. The memory address 490(1) stores the current ordering number 494(0) associated with the memory address 490(0). The memory addresses 492(2) and 490(C−1) store, respectively, the data values 492(2) and 492(C−1) and are non-orderable. In alternate embodiments, a particular memory address 490(x) may be identified in code as orderable and a different memory address 490(y) that stores the current ordering number 494(x) may be identified in code subject to one or more configuration constraints. An example of a configuration constraint is that the memory address 490(y) that stores the current ordering number 494(x) must lie in the same cache line sector as the memory address 490(x).

After one or more of the memory addresses 490 are configured as orderable, the L2 slice 270 receives an ordered atomic operation 410 from one of the SMs 310, and the atomic processing circuit 480 processes the ordered atomic operation 410. The ordered atomic operation 410 includes, without limitation, a target memory address 412, an increment flag 414, an atomic operation 416, an ordering number 418, and a value 419. The target memory address 412 specifies one of the memory addresses 490 that is orderable. Notably, the specific L2 slice 270 that receives the ordered atomic operation 410 from the SM 310 is determined based on the target memory address 412.

The atomic operation 416, specifies an operation that the atomic processing circuit 480 executes atomically (e.g., compare and swap). The value 419 is to be combined with the data value 492 stored at the target memory address 412 using the atomic operation 416. The ordering number 418 specifies that the atomic processing circuit 480 is to execute the atomic operation 416 on the target memory address 412 when the current ordering number 494 associated with the target memory address 412 is equal to the ordering number 418. The increment flag 414 specifies whether the atomic processing circuit 480 is to increment the current ordering number 494 after the atomic processing circuit 480 executes the atomic operation 416.

In alternate embodiments, the ordered atomic operation 410 may include any number and type of additional data and may be specified in any technically feasible fashion. For instance, in some embodiments, the ordered atomic operation 410 may include a size (e.g., 32 bits) of the data value 492 stored at the target memory address 408 that the atomic operation 410 is to operate on. In the same or other embodiments, the ordered atomic operation 410 may include a size (e.g., 16 bits) of the current ordering number 494. In the same or other embodiments, the ordered atomic operation 410 may include a value or another memory address 490 associated with the atomic operation 416.

As shown, the atomic processing circuit 480 includes, without limitation, an ordering unit 420, an atomic operation unit 430, a storage unit 450, and a retry unit 470. The ordering unit 420 determines whether to relay the ordered atomic operation 410 to the atomic operation unit 430 or the storage unit 450 based on the ordering number 418 and the current ordering number 494 associated with the target memory address 412. If the atomic operation unit 430 receives the ordered atomic operation 410, then the atomic operation unit 430 executes the atomic operation 416. If, however, the storage unit 450 receives the ordered atomic operation 410, then the storage unit 450 attempts to store the ordered atomic operation 410 in the CAM 460.

As shown, the CAM 460 includes, without limitation, any number of ordered atomic operations 410. Each of the ordered atomic operations 410 is stored based on the target memory address 412 and is associated with the SM 310 from which the ordered atomic operation 410 was received. The CAM 460 may be implemented in any technically feasible fashion.

In response to retry stimuli, the retry unit 470 selects the target memory address 412 and attempts to read one or more stored ordered atomic operations 410 from the CAM 460 based on the target memory address 412. The retry stimuli may include any number and type of conditions, events, and so forth. If the retry unit 470 is successful, then the retry unit 470 selects one of the stored ordered atomic operations 410. The retry unit 470 deletes the selected ordered atomic operation 410 from the CAM 460 and relays the selected ordered atomic operations 410 to the ordering unit 420 for re-processing.

Notably, in various embodiments, the atomic processing circuit 480 processes one ordered atomic operation 410 per clock cycle, thereby minimizing latency. For explanatory purposes only, solid lines depict how the atomic processing circuit 480 operates when the atomic operation unit 430 executes the atomic operation 416. By contrast, dotted lines depict how the atomic processing circuit 480 operates when the storage unit 450 stores the ordered atomic operation 410 in the CAM 460 and, at a later time, the retry unit 470 reads the ordered atomic operation 410 from the CAM. Dotted lines depict optional and error-related operations.

Upon receiving the ordered atomic operation 410, the ordering unit 420 compares the ordering number 418 to the current ordering number 494 associated with the target memory address 412. If the ordering number 418 is equal to the current ordering number 494, then the ordering unit 420 relays the ordered atomic operation 410 to the atomic operation unit 430.

If the atomic operation unit 430 receives the ordered atomic operation 410, then the atomic operation unit 430 executes the atomic operation 416 on the target memory address 412 to generate a result. Subsequently, if the increment flag 414 is equal to true, then the atomic operation unit 430 increments the current ordering number 494. If, however, the increment flag 414 is equal to false, then the atomic operation unit 430 does not modify the current ordering number 494. Finally, the atomic operation unit 430 returns the result and a success predicate 435 specifying true to the SM 310 that issued the ordered atomic operation 410. The success predicate 435 is also referred to herein as a notification. Importantly, in various embodiments, the operations that the ordered atomic unit 430 execute are atomic across the operations.

If, however, the storage unit 450 receives the ordered atomic operation 410, then the storage unit 450 determines whether the CAM 460 is full. If the CAM 460 is not full, then the storage unit 450 stores the ordered atomic operation 410 in the CAM 460 based on the target memory address 412. If, however, the CAM 460 is full, then the storage unit 450 returns the success predicate 435 of false to the SM 310 that issued the ordered atomic operation 410 and then discards the ordered atomic operation 410. In alternate embodiments, the storage unit 450 may include any amount and type of eviction logic that removes and/or replaces one or more of the ordered atomic operations 410 stored in the CAM 460 when the CAM 460 is full.

For instance, in some embodiments the storage unit 460 may select the ordered atomic operation 410 stored in the CAM 460 that includes the highest ordering number 418. If the ordering number 418 included in the selected ordered atomic operation 410 is higher than the ordering number 418 included in the newly received ordered atomic operation 410, then the storage unit 460 may delete the selected ordering atomic operation 410 from the CAM 460. The storage unit 460 may return the success predicate 435 of false to the SM 310 that issued the selected ordered atomic operation 410 and then discard the selected ordered atomic operation 410. Finally, the storage unit 460 may store the newly received ordered atomic operation 410 in the CAM 460 based on the target memory address 412.

In response to retry stimuli, the retry unit 470 performs one or more operations that may result in the re-processing of one of the ordered atomic operations 410 stored in the CAM 460. The retry stimuli may include any number and type of conditions, events, and so forth. For example, in various embodiments, the retry stimuli could include any number of a change to one of the current ordering numbers 494, a change to one of the memory addresses 490, an idle condition, a specified amount of time, and so forth. Upon detecting the retry stimuli, the retry unit 470 selects the target memory address 414. For example, if the retry stimuli comprises a change to one of the current ordering numbers 494, then the retry unit 470 could select the target memory address 414 associated with the changed current ordering number 494.

After selecting the target memory address 414, the retry unit 470 performs a look-up operation on the CAM 460 based on the target memory address 414. If the retry unit 470 receives one or more of the ordered atomic operations 410 in response to the look-up operation, then the retry unit 470 selects the received ordered atomic operation 410 that includes the lowest ordering number 418. The retry unit 470 then deletes the selected ordered atomic operation 410 from the CAM 460 and relays the selected ordered atomic operation 410 to the ordering unit 420 for re-processing.

In alternate embodiments, the retry unit 470 may select the ordered atomic operation 410 from the received ordered atomic operations 410 in any technically feasible fashion. In various embodiments, the retry unit 470 receives at most one ordered atomic operation 410 from the CAM 470, and the retry unit 470 selects any received ordered atomic operation 410.

As described above in the context of the ordered atomic operation 410 received from the SM 310, the ordering unit 420 relays the selected ordered atomic operation 410 to either the atomic operation unit 430 for execution or the storage unit 450 for re-storage in the CAM 460. If, however, the retry unit 480 does not receive any of the ordered atomic operations 410 in response to the look-up operation, then the retry unit 470 does not relay any ordered atomic operations 410 to the ordering unit 420.

Although not shown in FIG. 4, the atomic processing circuit 480 processes the ordered atomic operations 410 as well as conventional atomic operations received by the L2 slice 270. "Conventional" atomic operations refer to non-ordered atomic operations, such as the atomic operation 416. If the atomic processing circuit 480 receives a conventional atomic operation for the SM 310, then the atomic operation unit 430 executes the conventional atomic operation and returns the result to the SM 310. In various embodiments, the atomic processing circuit 480 may include any amount and type of resolution logic to process a conventional atomic operation targeting one of the memory addresses 490 that is orderable.

For example, suppose that the atomic processing circuit 480 receives a conventional atomic operation targeting the memory address $490(x)$ from the SM $310(y)$. In some embodiments, the atomic processing circuit 480 could perform a look-up operation on the CAM 460 based on the memory address 490(y) to retrieve one or more ordered atomic operations 410. The atomic processing circuit 480 could then select the retrieved ordered atomic operations 410 that were received from the SM 310(y). For each of the selected ordered atomic operations 410, the atomic processing circuit 480 could return the success predicate 435 of false to the SM 310(y), and delete the selected ordered atomic operation 410 from the CAM 460.

Note that the techniques described herein are illustrative rather than restrictive, and may be altered without departing from the broader spirit and scope of the invention. Many modifications and variations on the functionality provided by the L2 cache 260, the L2 slice 270, the atomic processing circuit 480, the ordered atomic operation 410, and the CAM 460 will be apparent to those of ordinary skill in the art without departing from the scope and spirit of the described embodiments. For instance, in various embodiments, any number of the techniques may be implemented while other techniques may be omitted or replaced in any technically feasible fashion.

In some embodiments, each of the L2 slices 270 implement timeout functionality. If one of the ordered atomic operations 410 is stored in the CAM 460 without being executed for longer than a threshold time, then the ordered atomic operation 410 is deleted from the CAM 460. Further, the success predicate 435 of false is sent to the SM 310 associated with the ordered atomic operation 410. Advantageously, when the computer system 100 is switching to a different context/program or shutdown, the timeout functionality enables the switch to occur with no transactions waiting in the L2 slices 270.

In alternate embodiments, the atomic processing circuit 480 may be implemented at any level in a memory hierarchy (e.g., L2 cache 260 instead of L2 slice 270). In some alternate embodiments, the atomic processing circuit 480 may be implemented in any type of cache or non-cache memory instead of the L2 cache 260. In some embodiments, the functionality provided by the ordering unit 420, the atomic operation unit 430, the storage unit 450, and the retry unit 470 may be implemented in any number and type of units in any combination. For example, the storage unit 450 and the retry unit 470 could be combined into a single CAM interface unit.

Processing Ordered Atomic Operations

Figure 5A:
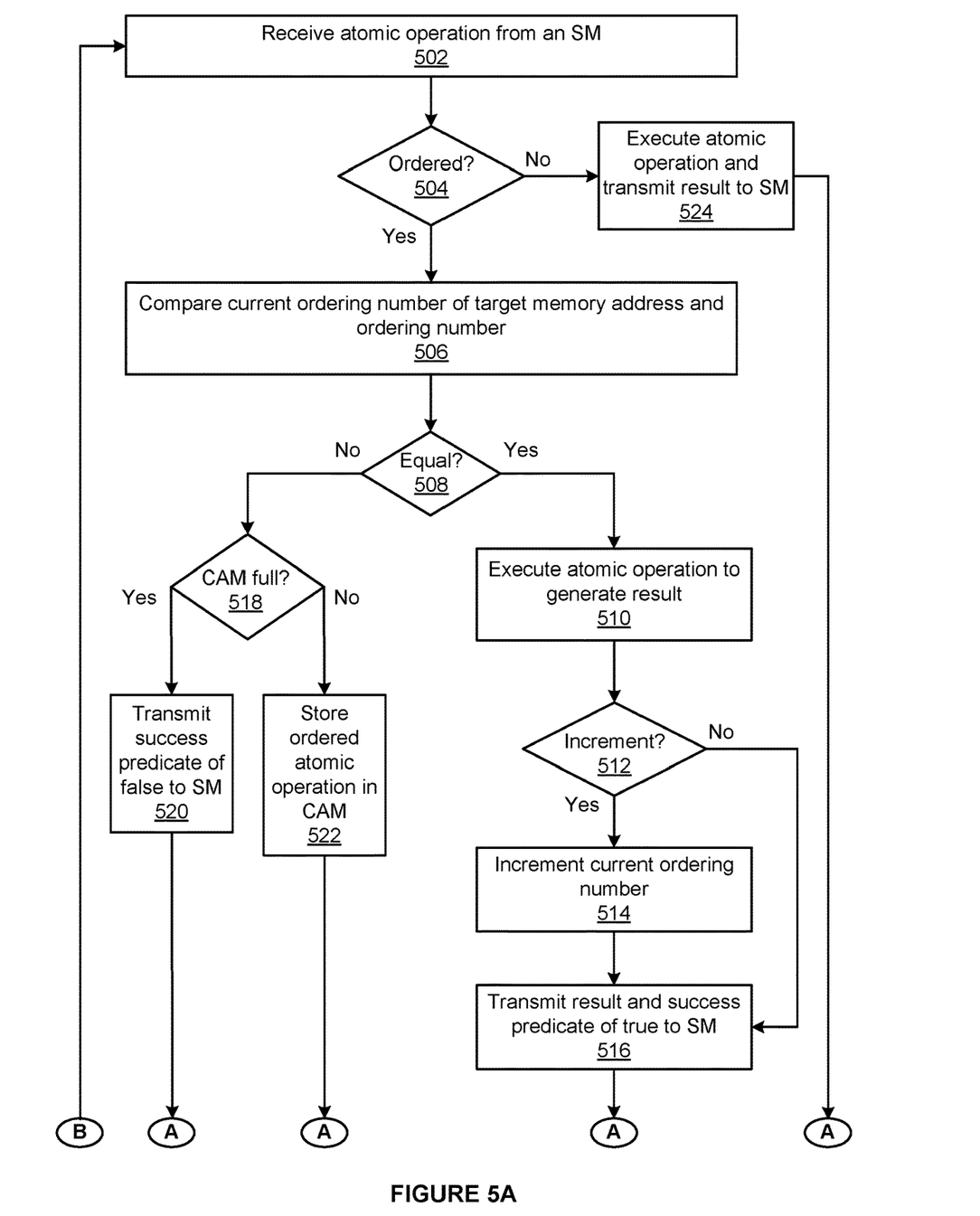
FIGS. 5A-5B set forth a flow diagram of method steps for processing atomic operations, according to various embodiments of the present invention.
Figure 5B:
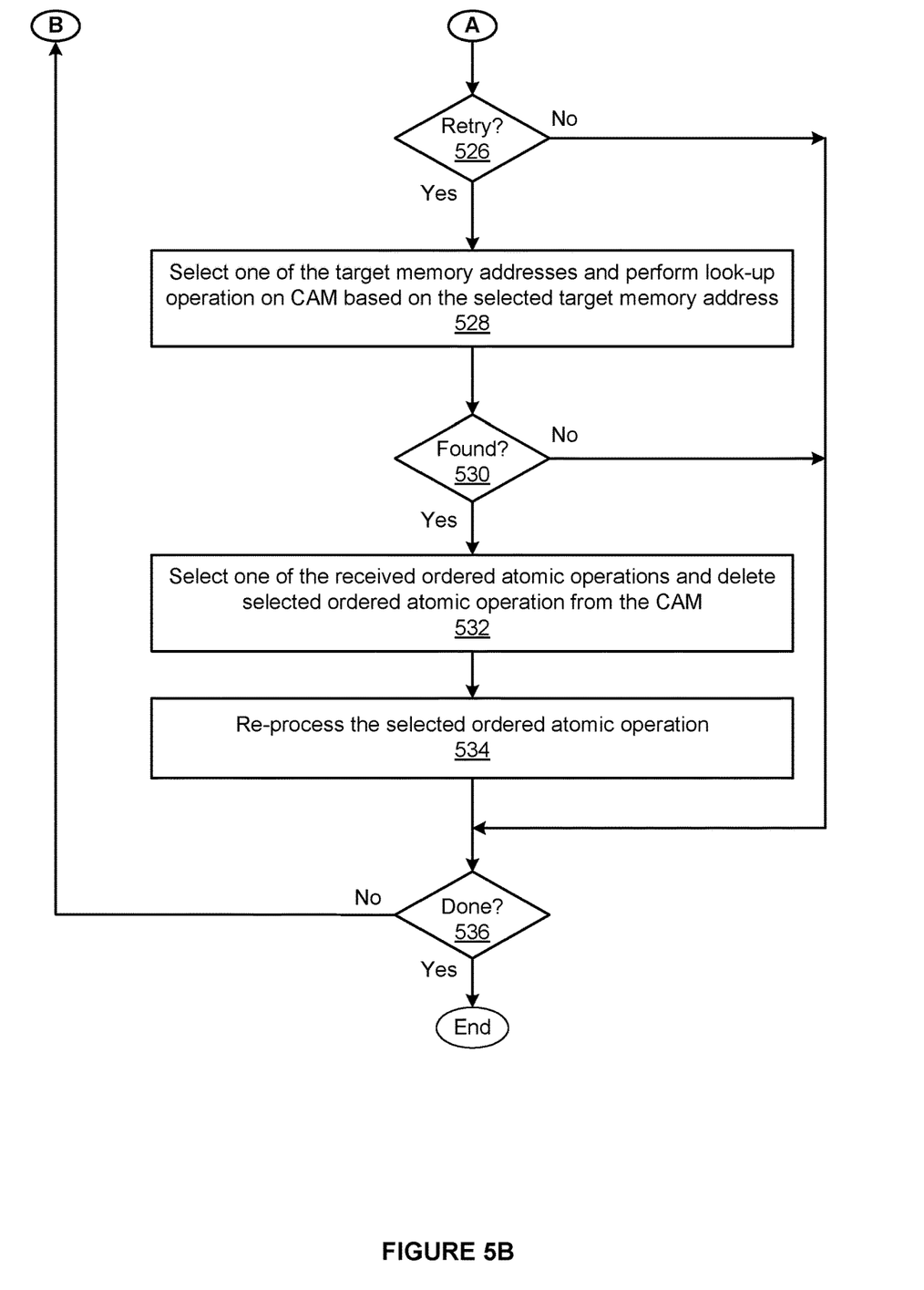

FIGS. 5A-5B set forth a flow diagram of method steps for processing atomic operations, according to various embodiments of the present invention. More specifically, the method steps ensure that ordered atomic operations 410 are executed in a consistent order. Although the method steps are described in conjunction with the systems of FIGS. 1-4, persons skilled in the art will understand that any system configured to perform the method steps, in any order, falls within the scope of the present invention. For explanatory purposes only, the method steps are described in the context of an L2 slice 270. However, any number of L2 slices 270 may execute the method steps serially, concurrently, or at least partially concurrently.

As shown, a method 500 begins at step 502, where the L2 slice 270 receives an atomic operation from the SM 310. At step 504, the atomic processing circuit 480 determines whether the atomic operation is the ordered atomic operation 410. If, at step 504, the atomic processing circuit 480 determines that the atomic operation is the ordered atomic operation 410, then the method 500 proceeds to step 506.

At step 506, the ordering unit 420 compares the ordering number 418 included in the ordered atomic operation 410 to the current ordering number 494 associated with the target memory address 412 included in the ordered atomic operation 410. If, at step 508, the ordering unit 420 determines that the ordered atomic operation 410 is equal to the current ordering number 494, then the method 500 proceeds to step 510.

At step 510, the atomic operation unit 430 executes the atomic operation 416 included in the ordered atomic operation 410 on the target memory address 412 to generate a result. At step 512, the atomic operation unit 430 determines whether the increment flag 414 included in the ordered atomic operation 410 is equal to true. If, at step 512, the atomic operation unit 430 determines that the increment flag 414 is equal to true, then the method 500 proceeds to step 514. At step 514, the atomic operation unit 430 increments the current ordering number 494 associated with the target memory address 412. If, however, at step 512, the atomic operation unit 430 determines that the increment flag 414 is equal to false, then the method 500 proceeds directly to step 516. At step 516, the atomic operation unit 430 transmits the result and the success predicate 435 of true to the SM 310. The method 500 then proceeds directly to step 524.

Returning now to step 508, if the storage unit 450 determines that the ordered atomic operation 410 is not equal to the current ordering number 494, then the method 500 proceeds directly to step 518. At step 518, the storage unit 450 determines whether the CAM 460 is full. If, at step 518, the storage unit 450 determines that the CAM 460 is full, then the method 500 proceeds to step 520. At step 520, the storage unit 450 transmits the success predicate 435 of false to the SM 310 and discards the ordered atomic operation 410. The method 500 then proceeds directly to step 526.

If, however, at step 518, the storage unit 450 determines that the CAM 460 is not full, then the method 500 proceeds directly to step 522. At step 522, the storage unit 450 stores the ordered atomic operation 510 in the CAM 460 based on the target memory address 412. The method 500 then proceeds directly to step 526.

Returning now to step 504, if the atomic processing circuit 480 determines that the atomic operation is not the ordered atomic operation 410, then the method 500 proceeds directly to step 524. At step 524, the atomic operation unit 430 executes the atomic operation to generate a result. The atomic processing circuit 480 then returns the result to the SM 310.

At step 526, the retry unit 470 determines whether the retry unit 470 has detected the retry stimuli. If, at step 526, the retry unit 470 determines that the retry unit 470 has detected the retry stimuli, then the method 500 proceeds to step 528. At step 528, the retry unit 470 selects one of the target memory address 414 and then performs a look-up operation on the CAM 460 based on the selected target memory address 414. At step 530, the retry unit 470 determines whether the retry unit 470 received one or more of the ordered atomic operations 410 from the CAM 460. If, at step 530, the retry unit 470 determines that the retry unit 470 received one or more of the ordered atomic operations 410 from the CAM 460, then the method 500 proceeds to step 532.

At step 532, the retry unit 470 selects one of the ordered atomic operations 410 received from the CAM 460 and deletes the selected ordered atomic operation 410 from the CAM 470. The retry unit 470 may select the ordered atomic operation 410 in any technically feasible fashion. For example, the retry unit 470 could select the returned ordered atomic operation 410 that includes the lowest ordering number 418. At step 534, the retry unit 470 transmits the selected ordered atomic operation 410 to the ordering unit 410 for re-processing. In general, the atomic processing circuit 480 executes the method steps 504-534 to re-processes the selected ordered atomic operation 410.

Returning now to step 526, if the retry unit 470 determines that the retry unit 470 has not detected the retry stimuli, then the method 500 proceeds directly to step 536. Further, if, at step 530, the retry unit 470 determines that the retry unit 470 did not receive any of the ordered atomic operations 410 from the CAM 460, then the method 500 also proceeds directly to step 536.

At step 536, the L2 slice 270 determines whether the L2 slice 270 is to cease operating (e.g., the parallel processing subsystem 112 is powering down). If at step 536, the L2 slice 270 determines that the L2 slice 270 is to continue operating, then the method 500 returns to step 502 where the L2 slice 270 receives a new atomic operation. If, however, at step 536, the L2 slice 270 determines that the L2 slice 270 is to cease operating, then the method 500 terminates.

In sum, the disclosed techniques may be used to efficiently and reliably order atomic operations. An atomic processing circuit included in an L2 slice ensures that each ordered atomic operation executes in a deterministic order relative to other ordered atomic operations. Each ordered atomic operation received by the atomic processing circuit specifies a target memory address that is orderable, an atomic operation, and an ordering number. Each target memory address included in the L2 slice is associated with a different memory address included in the L2 slice that stores a current ordering number associated with the target memory address.

The atomic processing circuit includes, without limitation, an ordering unit, an atomic operation unit, a storage unit, and a retry unit. Upon receiving an ordered atomic operation, the ordering unit performs a comparison operation between the ordering number and the current ordering number associated with the target memory address. If the ordering number is equal to the current ordering number, then the ordering unit relays the ordered atomic operation to the atomic operation unit The atomic operation unit then executes the atomic operation and, optionally, increments the current ordering number. If, however, the ordering number is not equal to the current ordering number, then the ordering unit relays the ordered atomic operation to the storage unit. The storage unit then stores ordered atomic operation in a content-addressable memory (CAM) based on the target memory address.

Upon detecting a change to a current ordering number, the retry unit performs a look-up operation on the CAM, where the look-up operation specifies the target memory address associated with the current ordering number. If the CAM returns one or more ordered atomic operations, then the retry unit selects the returned ordered atomic operation that includes the lowest ordering number. The retry unit then deletes the ordered atomic operation from the CAM and relays the selected ordered atomic operation to the ordering unit for re-processing.

Advantageously, the atomic processing circuit enables algorithms that execute on parallel processors to achieve deterministic results more efficiently relative to prior art. In particular, ordered atomic operations enable graphics algorithms to efficiently render images free of artifacts attributable to inconsistent ordering of atomic operations. Because each deferred ordered atomic operation is stored in a content-addressable memory (CAM) included in an L2 slice, the latencies associated with ordered atomic operations are decreased relative to the latencies typically experienced with prior art solutions. Further, because each memory slice includes an instance of the atomic processing circuit, the throughputs associated with ordering atomic operations are increased relative to the throughputs typically experienced with prior art solutions.

1. In some embodiments, a system comprises a first memory slice that includes a first memory address; a content-addressable memory (CAM) that stores a first ordered atomic operation specifying the first memory address; and an atomic processing circuit that performs a look-up operation on the CAM, wherein the look-up operation specifies the first memory address, receives the first ordered atomic operation from the CAM in response to the look-up operation, determines that a first ordering number specified in the first ordered atomic operation is equal to a first current ordering number associated with the first memory address, and processes a first atomic operation specified in the first ordered atomic operation.

2. The system of clause 1, wherein, prior to performing the look-up operation, the atomic processing circuit receives the first ordered atomic operation from a processor; determines that the first ordering number is not equal to the first current ordering number; and stores the first ordered atomic operation in the CAM based on the first memory address.

3. The system of clauses 1 or 2, wherein the atomic processing circuit performs the look-up operation on the CAM in response to detecting a change to the first current ordering number, a change to a data value stored at the first memory address, or an idle condition.

4. The system of any of clauses 1-3, wherein the atomic processing circuit further determines that an increment flag specified in the first ordered atomic operation indicates that the first ordering number is to be incremented when the first atomic operation is processed; and increments the first ordering number after processing the first atomic operation.

5. The system of any of clauses 1-4, wherein the atomic processing circuit further increments the first ordering number and deletes the first ordered atomic operation from the CAM after processing the first atomic operation.

6. The system of any of clauses 1-5, wherein the first current ordering number is stored at a second memory address that is included in the memory slice.

7. The system of any of clauses 1-6, wherein the atomic processing circuit further receives a second ordered atomic operation from a processor, wherein the second ordered atomic operation specifies a second memory address that is included in the first memory slice; determines that the second ordering number is equal to a second current ordering number associated with the second memory address; and processes a second atomic operation specified in the second ordered atomic operation.

8. The system of any of clauses 1-7, wherein, the atomic processing circuit further receives a second ordered atomic operation from a first processor, wherein the second ordered atomic operation specifies a second memory address that is included in the first memory slice; determines that the second ordering number is not equal to a second current ordering number associated with the second memory address; and stores the second atomic operation in the CAM based on the second memory address.

9. The system of any of clauses 1-8, wherein, prior to storing the second atomic operation in the CAM, the atomic processing circuit determines that the CAM is full; selects a third ordered atomic operation that is included in the CAM; deletes the third ordered atomic operation from the CAM;

and transmits a notification indicating that the third ordered atomic operation was not successfully processed.

10. In some embodiments, a method for processing atomic operations comprises performing a look-up operation on a content-addressable memory (CAM), wherein the look-up operation specifies the first memory address; receiving a first ordered atomic operation from the CAM in response to the look-up operation; determining that a first ordering number specified in the first ordered atomic operation is equal to a first current ordering number associated with the first memory address; and processing a first atomic operation specified in the first ordered atomic operation.

11. The method of clause 10, further comprising, prior to performing the look-up operation receiving the first ordered atomic operation from a processor; determining that the first ordering number is not equal to the first current ordering number; and storing the first ordered atomic operation in the CAM based on the first memory address.

12. The method of clause 10 or 11, further comprising determining that an increment flag specified in the first ordered atomic operation indicates that the first ordering number is to be incremented when the first atomic operation is processed; and incrementing the first ordering number after processing the first atomic operation.

13. The method of any of clauses 10-12, wherein the first current ordering number is stored at a second memory address that is adjacent to the first memory address.

14. The method of any of clauses 10-13, further comprising receiving a second ordered atomic operation from a processor, wherein the second ordered atomic operation specifies a second memory address that is included in the first memory slice; determining that the second ordering number is equal to a second current ordering number associated with the second memory address; and processing a second atomic operation specified in the second ordered atomic operation.

15. The method of any of clauses 10-14, further comprising receiving a second ordered atomic operation from a first processor, wherein the second ordered atomic operation specifies a second memory address that is included in the first memory slice; determining that the second ordering number is not equal to a second current ordering number associated with the second memory address; and storing the second ordered atomic operation in the CAM based on the second memory address.

16. The method of any of clauses 10-15, further comprising, prior to storing the second atomic operation in the CAM determining that the CAM is full; selecting a third ordered atomic operation that is included in the CAM; deleting the third ordered atomic operation from the CAM; and transmitting a notification indicating that the third ordered atomic operation was not successfully processed.

17. The method of any of clauses 10-16, wherein selecting the third ordered atomic operation comprises performing one or more comparison operations on a plurality of ordered atomic operations stored in the CAM to identify an ordered atomic operation that is associated with a higher current ordering number than any other ordered atomic operation stored in the CAM.

18. The method of any of clauses 10-17, further comprising receiving a second ordered atomic operation from a processor, wherein the second ordered atomic operation specifies a second memory address that is included in the first memory slice; determining that the second ordering number is not equal to a second current ordering number associated with the second memory address; determining that the CAM is full; and transmitting a notification indicating that the second ordered atomic operation was not successfully processed.

19. In some embodiments, a system comprises a content-addressable memory (CAM) that stores a first ordered atomic operation specifying a first memory address; and an atomic processing circuit that detects a change to a data value stored at the first memory address or to a first current ordering number, performs a look-up operation on the CAM, wherein the look-up operation specifies the first memory address, receives the first ordered atomic operation from the CAM in response to the look-up operation, determines that a first ordering number specified in the first ordered atomic operation is equal to the first current ordering number, processes a first atomic operation specified in the first ordered atomic operation, increments the first current ordering number, and transmits a notification indicating successful completion of the first ordered atomic operation.

20. The system of clause 19, wherein, prior to performing the look-up operation, the atomic processing circuit receives the first ordered atomic operation from a processor; determines that the first ordering number is not equal to the first current ordering number; and stores the first ordered atomic operation in the CAM based on the first memory address.

Any and all combinations of any of the claim elements recited in any of the claims and/or any elements described in this application, in any fashion, fall within the contemplated scope of the present invention and protection The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. For example, the various embodiments described herein may be implemented in cloud computing environments, within one or more server machines for purposes of gaming, graphics, video streaming, etc., or any Vehicle Navigation, Infotainment or instrument cluster controller system (e.g., as found in automobiles). The NVIDIA GeForce NOW® is an example of a networked gaming service that can leverage the various embodiments to enhance performance and the overall user experience. The various embodiments also may be implemented in any systems or machines configured for virtual reality applications or for generating output for stereoscopic display.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A system, comprising:
    a first memory slice that includes a first memory address;
    a content-addressable memory (CAM) that is separate from the first memory slice and stores a first ordered atomic operation, wherein the first ordered atomic operation includes a first data field specifying the first memory address, and wherein the first ordered atomic operation is stored in the CAM based on the first memory address specified in the first data field; and
    an atomic processing circuit that:
        performs a look-up operation on the CAM, wherein the look-up operation specifies the first memory address,
        receives the first ordered atomic operation from the CAM in response to the look-up operation,
        determines that a first ordering number specified in a second data field of the first ordered atomic operation is equal to a first current ordering number associated with the first memory address, and
        processes a first atomic operation specified in a third data field of the first ordered atomic operation.

2. The system of claim 1, wherein, prior to performing the look-up operation, the atomic processing circuit:
    receives the first ordered atomic operation from a processor;
    determines that the first ordering number is not equal to the first current ordering number; and
    stores the first ordered atomic operation in the CAM based on the first memory address.

3. The system of claim 2, wherein the atomic processing circuit performs the look-up operation on the CAM in response to detecting a change to the first current ordering number, a change to a data value stored at the first memory address, or an idle condition.

4. The system of claim 1, wherein the atomic processing circuit further:
    determines that an increment flag specified in the first ordered atomic operation indicates that the first ordering number is to be incremented when the first atomic operation is processed; and
    increments the first ordering number after processing the first atomic operation.

5. The system of claim 1, wherein the atomic processing circuit further increments the first ordering number and deletes the first ordered atomic operation from the CAM after processing the first atomic operation.

6. The system of claim 1, wherein the first current ordering number is stored at a second memory address that is included in the memory slice.

7. The system of claim 1, wherein the atomic processing circuit further:
    receives a second ordered atomic operation from a processor, wherein the second ordered atomic operation specifies a second memory address that is included in the first memory slice;
    determines that the second ordering number is equal to a second current ordering number associated with the second memory address; and
    processes a second atomic operation specified in the second ordered atomic operation.

8. The system of claim 1, wherein, the atomic processing circuit further:
    receives a second ordered atomic operation from a first processor, wherein the second ordered atomic operation specifies a second memory address that is included in the first memory slice;
    determines that the second ordering number is not equal to a second current ordering number associated with the second memory address; and
    stores the second atomic operation in the CAM based on the second memory address.

9. The system of claim 8, wherein, prior to storing the second atomic operation in the CAM, the atomic processing circuit:
    determines that the CAM is full;
    selects a third ordered atomic operation that is included in the CAM;

deletes the third ordered atomic operation from the CAM; and transmits a notification indicating that the third ordered atomic operation was not successfully processed.

10. A method for processing atomic operations, the method comprising:
storing a first ordered atomic operation specifying a first memory address in a content-addressable memory (CAM), wherein a first memory slice that is separate from the CAM includes the first memory address, wherein the first ordered atomic operation includes a first data field specifying the first memory address, and wherein the first ordered atomic operation is stored in the CAM based on the first memory address;
performing a look-up operation on the CAM, wherein the look-up operation specifies the first memory address;
receiving the first ordered atomic operation from the CAM in response to the look-up operation;
determining that a first ordering number specified in a second data field of the first ordered atomic operation is equal to a first current ordering number associated with the first memory address; and
processing a first atomic operation specified in a third data field of the first ordered atomic operation.

11. The method of claim 10, further comprising, prior to performing the look-up operation:
receiving the first ordered atomic operation from a processor;
determining that the first ordering number is not equal to the first current ordering number; and
storing the first ordered atomic operation in the CAM based on the first memory address.

12. The method of claim 10, further comprising:
determining that an increment flag specified in the first ordered atomic operation indicates that the first ordering number is to be incremented when the first atomic operation is processed; and
incrementing the first ordering number after processing the first atomic operation.

13. The method of claim 10, wherein the first current ordering number is stored at a second memory address that is adjacent to the first memory address.

14. The method of claim 10, further comprising
receiving a second ordered atomic operation from a processor, wherein the second ordered atomic operation specifies a second memory address that is included in the first memory slice;
determining that the second ordering number is equal to a second current ordering number associated with the second memory address; and
processing a second atomic operation specified in the second ordered atomic operation.

15. The method of claim 10, further comprising:
receiving a second ordered atomic operation from a first processor, wherein the second ordered atomic operation specifies a second memory address that is included in the first memory slice;
determining that the second ordering number is not equal to a second current ordering number associated with the second memory address; and
storing the second atomic operation in the CAM based on the second memory address.

16. The method of claim 15, further comprising, prior to storing the second atomic operation in the CAM:
determining that the CAM is full;
selecting a third ordered atomic operation that is included in the CAM;

deleting the third ordered atomic operation from the CAM; and
transmitting a notification indicating that the third ordered atomic operation was not successfully processed.

17. The method of claim 16, wherein selecting the third ordered atomic operation comprises performing one or more comparison operations on a plurality of ordered atomic operations stored in the CAM to identify an ordered atomic operation that is associated with a higher current ordering number than any other ordered atomic operation stored in the CAM.

18. The method of claim 10, further comprising:
receiving a second ordered atomic operation from a processor, wherein the second ordered atomic operation specifies a second memory address that is included in the first memory slice;
determining that the second ordering number is not equal to a second current ordering number associated with the second memory address;
determining that the CAM is full; and
transmitting a notification indicating that the second ordered atomic operation was not successfully processed.

19. A system, comprising:
a content-addressable memory (CAM) that is separate from a first memory slice that includes a first memory address and that stores a first ordered atomic operation, wherein the first ordered operation includes a first data field specifying the first memory address, and wherein the first ordered atomic operation is stored in the CAM based on the first memory address specified in the first data field; and
an atomic processing circuit that:
detects a change to a data value stored at the first memory address or to a first current ordering number,
performs a look-up operation on the CAM, wherein the look-up operation specifies the first memory address,
receives the first ordered atomic operation from the CAM in response to the look-up operation,
determines that a first ordering number specified in a second data field of the first ordered atomic operation is equal to the first current ordering number,
processes a first atomic operation specified in a third data field of the first ordered atomic operation,
increments the first current ordering number, and
transmits a notification indicating successful completion of the first ordered atomic operation.

20. The system of claim 19, wherein, prior to performing the look-up operation, the atomic processing circuit:
receives the first ordered atomic operation from a processor;
determines that the first ordering number is not equal to the first current ordering number; and
stores the first ordered atomic operation in the CAM based on the first memory address.

21. A system, comprising:
a first memory slice that includes a first memory address;
a content-addressable memory (CAM) that stores a first ordered atomic operation specifying the first memory address; and
an atomic processing circuit that:
performs a look-up operation on the CAM, wherein the look-up operation specifies the first memory address, wherein, prior to performing the look-up operation, the atomic processing circuit:

receives the first ordered atomic operation from a processor,
determines that a first ordering number specified in the first ordered atomic operation is not equal to a first current ordering number associated with the first memory address, and
stores the first ordered atomic operation in the CAM based on the first memory address, receives the first ordered atomic operation from the CAM in response to the look-up operation, determines that the first ordering number specified in the first ordered atomic operation is equal to the first current ordering number associated with the first memory address, and processes a first atomic operation specified in the first ordered atomic operation.

\* \* \* \* \*